(12) United States Patent
Pagaila et al.

(10) Patent No.: US 7,799,602 B2
(45) Date of Patent: Sep. 21, 2010

(54) SEMICONDUCTOR DEVICE AND METHOD OF FORMING A SHIELDING LAYER OVER A SEMICONDUCTOR DIE AFTER FORMING A BUILD-UP INTERCONNECT STRUCTURE

(75) Inventors: Reza A. Pagaila, Singapore (SG); Rui Huang, Singapore (SG); Yaojian Lin, Singapore (SG)

(73) Assignee: STATS ChipPAC, Ltd., Singapore (SG)

( * ) Notice: Subject to any disclaimer, the term of this patent is extended or adjusted under 35 U.S.C. 154(b) by 0 days.

(21) Appl. No.: 12/332,277

(22) Filed: Dec. 10, 2008

(65) Prior Publication Data

US 2010/0140759 A1   Jun. 10, 2010

(51) Int. Cl.
H01L 21/44 (2006.01)
H01L 21/48 (2006.01)
H01L 21/50 (2006.01)

(52) U.S. Cl. .............. 438/106; 438/618; 438/119; 438/679; 438/680; 257/E21.007; 257/E21.17; 257/E21.229; 257/E21.245; 257/E21.267; 257/E21.304; 257/E21.499; 257/E21.502; 257/E21.511

(58) Field of Classification Search .......... 438/106, 438/113, 127, 506, 505, 508, 197, 119, 679, 438/680, 687, 688, 706, 745, 692; 257/E21.17, 257/7, 229, 245, 267, 304, 499, 502, 511
See application file for complete search history.

(56) References Cited

U.S. PATENT DOCUMENTS

| 5,250,843 | A | 10/1993 | Eichelberger |
| 5,353,498 | A | 10/1994 | Fillion et al. |
| 5,694,300 | A * | 12/1997 | Mattei et al. ............. 361/818 |
| 5,841,193 | A | 11/1998 | Eichelberger |
| 5,866,943 | A * | 2/1999 | Mertol ..................... 257/712 |
| 6,472,724 | B1 * | 10/2002 | Matsuzawa et al. ....... 257/659 |
| 6,838,748 | B2 | 1/2005 | Ishio et al. |
| 7,102,367 | B2 * | 9/2006 | Yamagishi et al. ........ 324/754 |
| 7,466,152 | B2 * | 12/2008 | Shioga et al. ............. 324/754 |
| 7,619,901 | B2 | 11/2009 | Eichelberger et al. |

* cited by examiner

*Primary Examiner*—David Nhu
(74) *Attorney, Agent, or Firm*—Robert D. Atkins

(57) ABSTRACT

A semiconductor device is made by forming a build-up interconnect structure over a substrate. A semiconductor die is mounted to the build-up interconnect structure. The semiconductor die is electrically connected to the build-up interconnect structure. A ground pad is formed on the build-up interconnect structure. An encapsulant is formed over the semiconductor die and build-up interconnect structure. A shielding cage can be formed over the semiconductor die prior to forming the encapsulant. A shielding layer is formed over the encapsulant after forming the build-up interconnect structure to isolate the semiconductor die from inter-device interference. The shielding layer conforms to a geometry of the encapsulant and electrically connects to the ground pad. The shielding layer can be electrically connected to ground through a conductive pillar. The substrate is removed. A backside interconnect structure is formed over the build-up interconnect structure, opposite the semiconductor die.

20 Claims, 6 Drawing Sheets

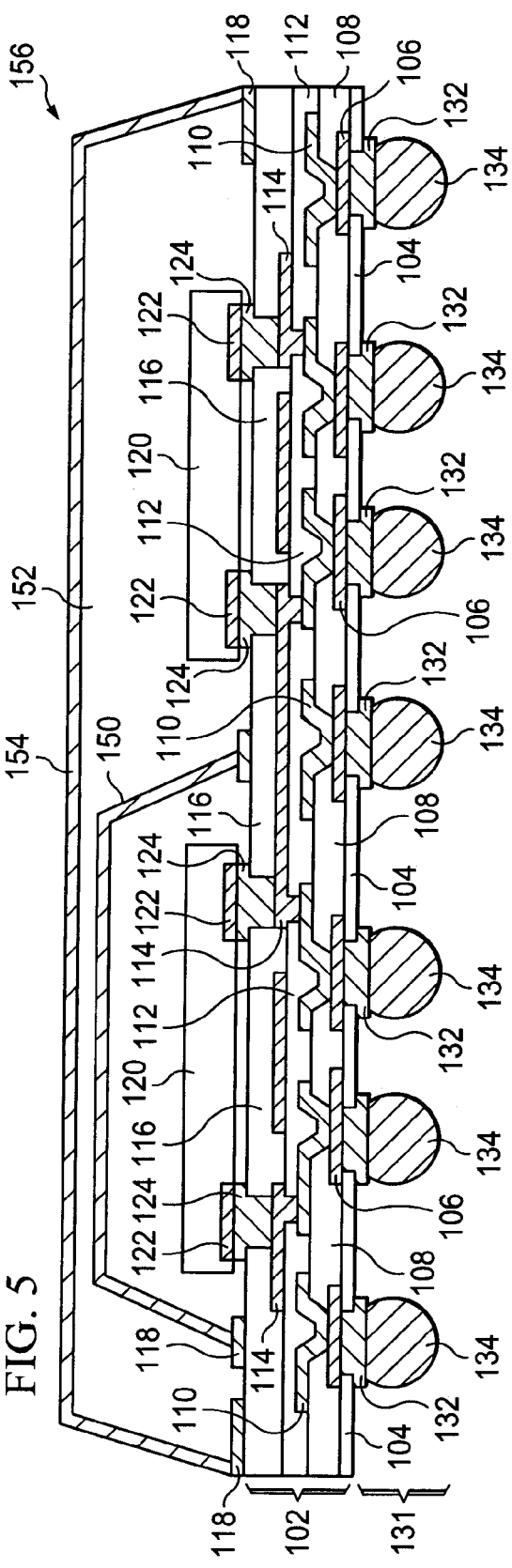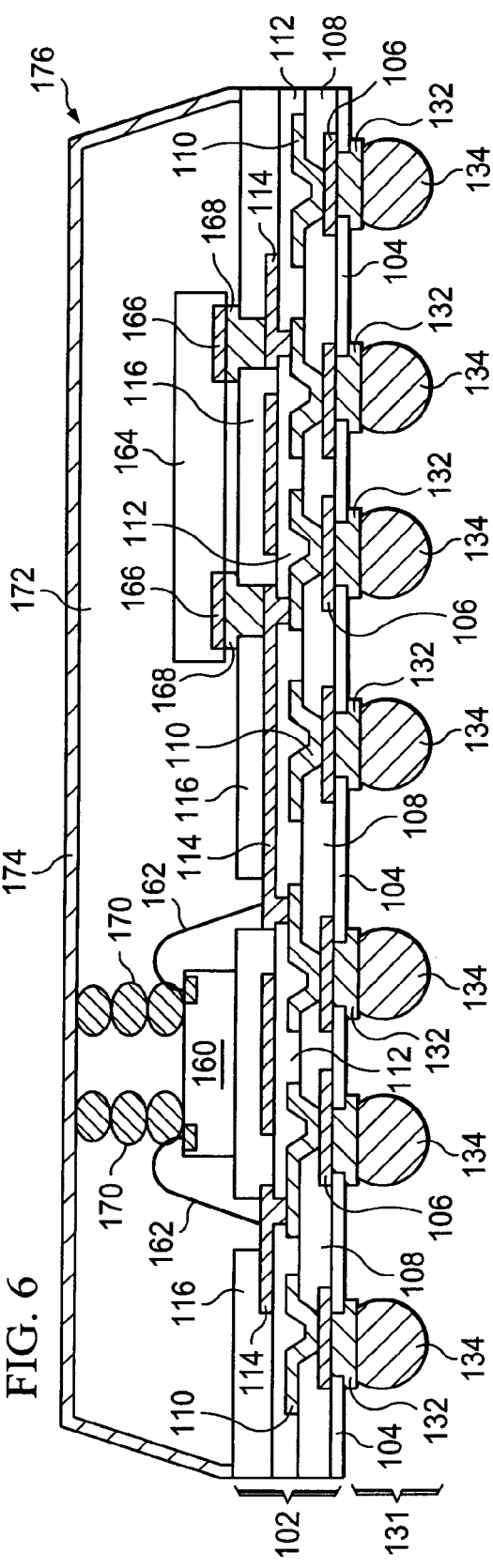

SEMICONDUCTOR DEVICE AND METHOD OF FORMING A SHIELDING LAYER OVER A SEMICONDUCTOR DIE AFTER FORMING A BUILD-UP INTERCONNECT STRUCTURE

FIELD OF THE INVENTION

The present invention relates in general to semiconductor devices and, more particularly, to a semiconductor device and method of forming a shielding layer over a semiconductor die after forming a build-up interconnect structure.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as high-speed calculations, transmitting and receiving electromagnetic signals, controlling electronic devices, transforming sunlight to electricity, and creating visual projections for television displays. Semiconductor devices are found in the fields of entertainment, communications, power generation, networks, computers, and consumer products. Semiconductor devices are also found in electronic products including military, aviation, automotive, industrial controllers, and office equipment.

Semiconductor devices exploit the electrical properties of semiconductor materials. The atomic structure of semiconductor material allows its electrical conductivity to be manipulated by the application of an electric field or through the process of doping. Doping introduces impurities into the semiconductor material to manipulate and control the conductivity of the semiconductor device.

A semiconductor device contains active and passive electrical structures. Active structures, including transistors, control the flow of electrical current. By varying levels of doping and application of an electric field, the transistor either promotes or restricts the flow of electrical current. Passive structures, including resistors, diodes, and inductors, create a relationship between voltage and current necessary to perform a variety of electrical functions. The passive and active structures are electrically connected to form logic circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each die is typically identical and contains circuits formed by electrically connecting active and passive components. Back-end manufacturing involves singulating individual die from the finished wafer and packaging the die to provide structural support and environmental isolation.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller die size may be achieved by improvements in the front-end process resulting in die with smaller, higher density active and passive components. Back-end processes may result in semiconductor device packages with a smaller footprint by improvements in electrical interconnection and packaging materials.

Another goal of semiconductor manufacturing is to produce higher performance semiconductor devices. Increases in device performance can be accomplished by forming active components that are capable of operating at higher speeds. In high frequency applications, such as radio frequency (RF) wireless communications, integrated passive devices (IPDs) are often contained within the semiconductor device. Examples of IPDs include resistors, capacitors, and inductors. A typical RF system requires multiple IPDs in one or more semiconductor packages to perform the necessary electrical functions. The high frequency electrical devices are susceptible to undesired electromagnetic interference (EMI) and radio frequency interference (RFI), or other inter-device interference, such as capacitive, inductive, or conductive coupling, also known as cross-talk, which can interfere with their operation.

SUMMARY OF THE INVENTION

A need exists to isolate semiconductor die from EMI, RFI, and other inter-device interference. Accordingly, in one embodiment, the present invention is a method of making a semiconductor device comprising the steps of providing a substrate, forming a build-up interconnect structure over the substrate, and mounting a semiconductor die to the build-up interconnect structure. The semiconductor die is electrically connected to the build-up interconnect structure. The method further includes the steps of forming a ground pad on the build-up interconnect structure, forming an encapsulant over the semiconductor die and build-up interconnect structure, and forming a shielding layer over the encapsulant after forming the build-up interconnect structure to isolate the semiconductor die from inter-device interference. The shielding layer conforms to a geometry of the encapsulant and electrically connects to the ground pad. The method further includes the steps of removing the substrate, and forming a backside interconnect structure over the build-up interconnect structure, opposite the semiconductor die.

In another embodiment, the present invention is a method of making a semiconductor device comprising the steps of providing a substrate, forming a build-up interconnect structure over the substrate, and mounting a semiconductor die to the build-up interconnect structure. The semiconductor die is electrically connected to the build-up interconnect structure. The method further includes the step of forming a shielding cage over the semiconductor die after forming the build-up interconnect structure to isolate the semiconductor die from inter-device interference. The shielding cage is electrically connected to a ground point. The method further includes the steps of forming an encapsulant over the semiconductor die, shielding cage, and build-up interconnect structure, and removing the substrate.

In another embodiment, the present invention is a method of making a semiconductor device comprising the steps of providing a substrate, forming a build-up interconnect structure over the substrate, mounting a semiconductor die to the build-up interconnect structure, forming an encapsulant over the semiconductor die and build-up interconnect structure, and forming a shielding layer over the semiconductor die after forming the build-up interconnect structure to isolate the semiconductor die from inter-device interference. The shielding layer is electrically connected to a ground point. The method further includes the step of removing the substrate.

In another embodiment, the present invention is a semiconductor device comprising a build-up interconnect structure and semiconductor die mounted to the build-up interconnect structure. The semiconductor die is electrically connected to the build-up interconnect structure. An encapsulant is formed over the semiconductor die and build-up interconnect structure. A shielding layer is formed over the semiconductor die to isolate the semiconductor die from inter-device interference. The shielding layer is electrically connected to a ground point.

BRIEF DESCRIPTION OF THE DRAWINGS

FIG. 5 illustrates a shielding cage formed over the semiconductor die prior to forming the shielding layer;

FIG. 6 illustrates a conductive pillar implemented as studs or bumps electrically connecting the shielding layer to a ground point.

DETAILED DESCRIPTION OF THE DRAWINGS

Figure 1:
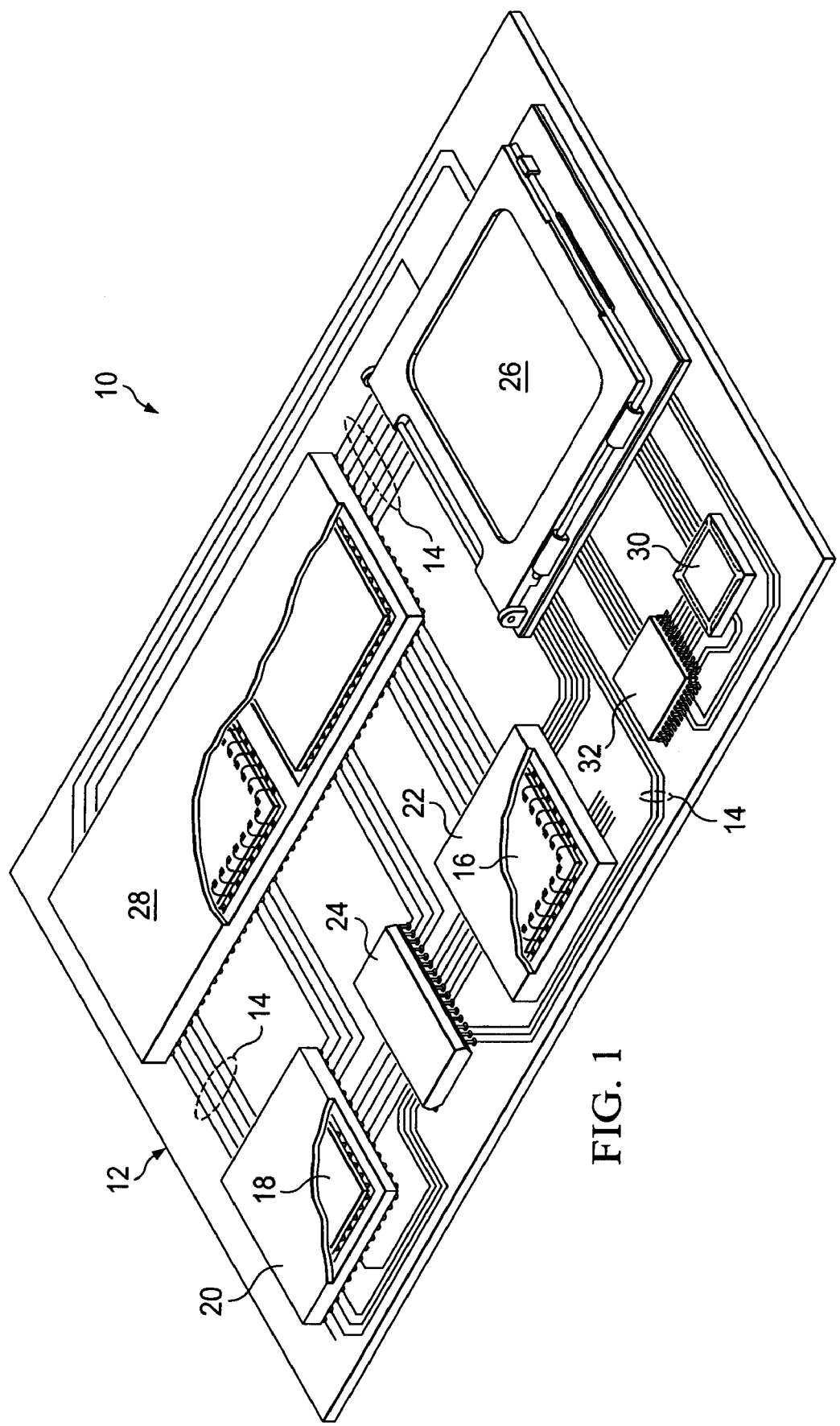
FIG. 1 illustrates a printed circuit board (PCB) with different types of packages mounted to its surface.

The present invention is described in one or more embodiments in the following description with reference to the Figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors, have the ability to control the flow of electrical current. Passive electrical components, such as capacitors, inductors, resistors, and transformers, create a relationship between voltage and current necessary to perform electrical circuit functions.

Passive and active components are formed on the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into a permanent insulator, permanent conductor, or changing the way the semiconductor material changes in conductivity in response to an electric field. Transistors contain regions of varying types and degrees of doping arranged as necessary to enable the transistor to promote or restrict the flow of electrical current upon the application of an electric field.

Active and passive components are formed by layers of materials with different electrical properties. The layers can be formed by a variety of deposition techniques determined in part by the type of material being deposited. For example, thin film deposition may involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. The portion of the photoresist pattern subjected to light is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual die and then packaging the die for structural support and environmental isolation. To singulate the die, the wafer is scored and broken along non-functional regions of the wafer called saw streets or scribes. The wafer is singulated using a laser cutting device or saw blade. After singulation, the individual die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIG. 1 illustrates electronic device 10 having a chip carrier substrate or printed circuit board (PCB) 12 with a plurality of semiconductor packages mounted on its surface. Electronic device 10 may have one type of semiconductor package, or multiple types of semiconductor packages, depending on the application. The different types of semiconductor packages are shown in FIG. 1 for purposes of illustration.

Electronic device 10 may be a stand-alone system that uses the semiconductor packages to perform an electrical function. Alternatively, electronic device 10 may be a subcomponent of a larger system. For example, electronic device 10 may be a graphics card, network interface card, or other signal processing card that can be inserted into a computer. The semiconductor package can include microprocessors, memories, application specific integrated circuits (ASICs), logic circuits, analog circuits, RF circuits, discrete devices, or other semiconductor die or electrical components.

In FIG. 1, PCB 12 provides a general substrate for structural support and electrical interconnect of the semiconductor packages mounted on the PCB. Conductive signal traces 14 are formed on a surface or within layers of PCB 12 using evaporation, electrolytic plating, electroless plating, screen printing, PVD, or other suitable metal deposition process. Signal traces 14 provide for electrical communication between each of the semiconductor packages, mounted components, and other external system components. Traces 14 also provide power and ground connections to each of the semiconductor packages.

In some embodiments, a semiconductor device has two packaging levels. First level packaging is a technique for mechanically and electrically attaching the semiconductor die to a carrier. Second level packaging involves mechanically and electrically attaching the carrier to the PCB. In other embodiments, a semiconductor device may only have the first level packaging where the die is mechanically and electrically mounted directly to the PCB.

For the purpose of illustration, several types of first level packaging, including wire bond package 16 and flip chip 18, are shown on PCB 12. Additionally, several types of second level packaging, including ball grid array (BGA) 20, bump chip carrier (BCC) 22, dual in-line package (DIP) 24, land grid array (LGA) 26, multi-chip module (MCM) 28, quad flat non-leaded package (QFN) 30, and quad flat package 32, are shown mounted on PCB 12. Depending upon the system requirements, any combination of semiconductor packages, configured with any combination of first and second level packaging styles, as well as other electronic components, can be connected to PCB 12. In some embodiments, electronic device 10 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using cheaper components and a shorter manufacturing process. The resulting devices are less likely to fail and less expensive to manufacture resulting in lower costs for consumers.

Figure 2A:
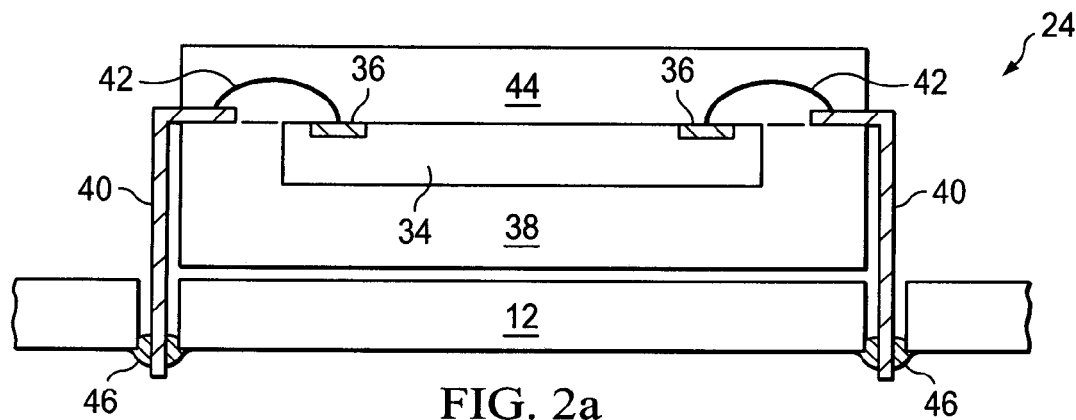
FIGS. 2a-2c illustrate further detail of the representative semiconductor packages mounted to the PCB.

FIG. 2a illustrates further detail of DIP 24 mounted on PCB 12. DIP 24 includes semiconductor die 34 having contact pads 36. Semiconductor die 34 includes an active region containing analog or digital circuits implemented as active devices, passive devices, conductive layers, and dielectric layers formed within semiconductor die 34 and are electrically interconnected according to the electrical design of the die. For example, the circuit may include one or more transistors, diodes, inductors, capacitors, resistors, and other circuit elements formed within the active region of die 34. Contact pads 36 are made with a conductive material, such as aluminum (Al), copper (Cu), tin (Sn), nickel (Ni), gold (Au), or silver (Ag), and are electrically connected to the circuit elements formed within die 34. Contact pads 36 are formed by PVD, CVD, electrolytic plating, or electroless plating process. During assembly of DIP 24, semiconductor die 34 is mounted to a carrier 38 using a gold-silicon eutectic layer or adhesive material such as thermal epoxy. The package body includes an insulative packaging material such as polymer or ceramic. Conductor leads 40 are connected to carrier 38 and wire bonds 42 are formed between leads 40 and contact pads 36 of die 34 as a first level packaging. Encapsulant 44 is deposited over the package for environmental protection by preventing moisture and particles from entering the package and contaminating die 34, contact pads 36, or wire bonds 42. DIP 24 is connected to PCB 12 by inserting leads 40 into holes formed through PCB 12. Solder material 46 is flowed around leads 40 and into the holes to physically and electrically connect DIP 24 to PCB 12. Solder material 46 can be any metal or electrically conductive material, e.g., Sn, lead (Pb), Au, Ag, Cu, zinc (Zn), bismuthinite (Bi), and alloys thereof, with an optional flux material. For example, the solder material can be eutectic Sn/Pb, high-lead, or lead-free.

Figure 2B:
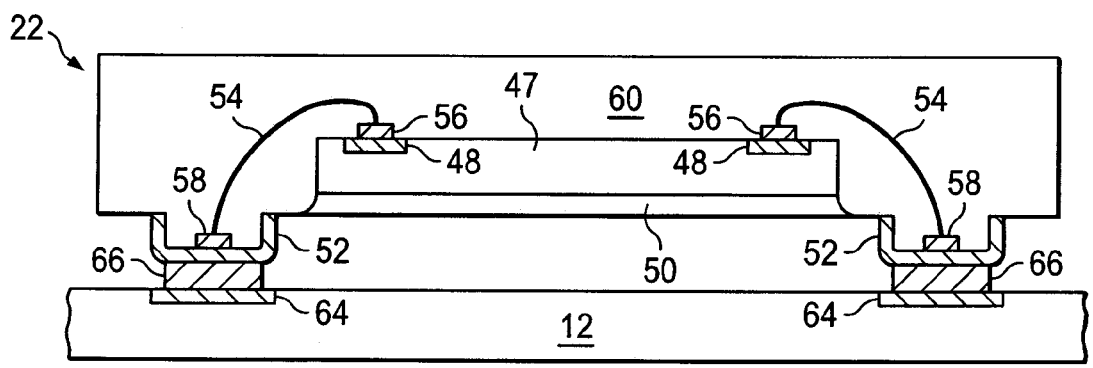

FIG. 2b illustrates further detail of BCC 22 mounted on PCB 12. Semiconductor die 47 is connected to a carrier by wire bond style first level packaging. BCC 22 is mounted to PCB 12 with a BCC style second level packaging. Semiconductor die 47 having contact pads 48 is mounted over a carrier using an underfill or epoxy-resin adhesive material 50. Semiconductor die 47 includes an active region containing analog or digital circuits implemented as active devices, passive devices, conductive layers, and dielectric layers formed within semiconductor die 47 and are electrically interconnected according to the electrical design of the die. For example, the circuit may include one or more transistors, diodes, inductors, capacitors, resistors, and other circuit elements formed within the active region of die 47. Contact pads 48 are made with a conductive material, such as Al, Cu, Sn, Ni, Au, or Ag, and are electrically connected to the circuit elements formed within die 47. Contact pads 48 are formed by PVD, CVD, electrolytic plating, or electroless plating process. Wire bonds 54 and bond pads 56 and 58 electrically connect contact pads 48 of semiconductor die 47 to contact pads 52 of BCC 22 forming the first level packaging. Molding compound or encapsulant 60 is deposited over semiconductor die 47, wire bonds 54, contact pads 48, and contact pads 52 to provide physical support and electrical isolation for the device. Contact pads 64 are formed on a surface of PCB 12 using evaporation, electrolytic plating, electroless plating, screen printing, PVD, or other suitable metal deposition process and are typically plated to prevent oxidation. Contact pads 64 electrically connect to one or more conductive signal traces 14. Solder material is deposited between contact pads 52 of BCC 22 and contact pads 64 of PCB 12. The solder material is reflowed to form bumps 66 which form a mechanical and electrical connection between BCC 22 and PCB 12.

Figure 2C:
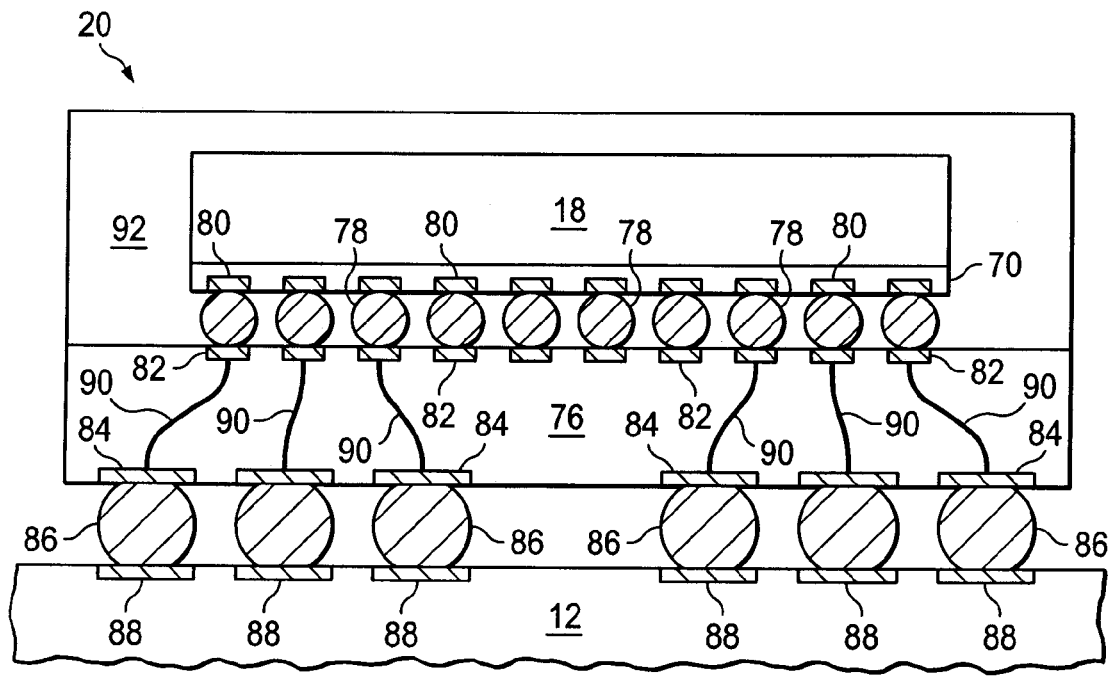

In FIG. 2c, semiconductor die 18 is mounted face down to carrier 76 with a flip chip style first level packaging. BGA 20 is attached to PCB 12 with a BGA style second level packaging. Active region 70 containing analog or digital circuits implemented as active devices, passive devices, conductive layers, and dielectric layers formed within semiconductor die 18 is electrically interconnected according to the electrical design of the die. For example, the circuit may include one or more transistors, diodes, inductors, capacitors, resistors, and other circuit elements formed within active region 70 of semiconductor die 18. Semiconductor die 18 is electrically and mechanically attached to carrier 76 through a large number of individual conductive solder bumps or balls 78. Solder bumps 78 are formed on bump pads or interconnect sites 80, which are disposed on active region 70. Bump pads 80 are made with a conductive material, such as Al, Cu, Sn, Ni, Au, or Ag, and are electrically connected to the circuit elements formed in active region 70. Bump pads 80 are formed by PVD, CVD, electrolytic plating, or electroless plating process. Solder bumps 78 are electrically and mechanically connected to contact pads or interconnect sites 82 on carrier 76 by a solder reflow process.

BGA 20 is electrically and mechanically attached to PCB 12 by a large number of individual conductive solder bumps or balls 86. The solder bumps are formed on bump pads or interconnect sites 84. The bump pads 84 are electrically connected to interconnect sites 82 through conductive lines 90 routed through carrier 76. Contact pads 88 are formed on a surface of PCB 12 using evaporation, electrolytic plating, electroless plating, screen printing, PVD, or other suitable metal deposition process and are typically plated to prevent oxidation. Contact pads 88 electrically connect to one or more conductive signal traces 14. The solder bumps 86 are electrically and mechanically connected to contact pads or bonding pads 88 on PCB 12 by a solder reflow process. Molding compound or encapsulant 92 is deposited over semiconductor die 18 and carrier 76 to provide physical support and electrical isolation for the device. The flip chip semiconductor device provides a short electrical conduction path from the active devices on semiconductor die 18 to conduction tracks on PCB 12 in order to reduce signal propagation distance, lower capacitance, and achieve overall better circuit performance. In another embodiment, the semiconductor die 18 can be mechanically and electrically attached directly to PCB 12 using flip chip style first level packaging without carrier 76.

Figure 3A:
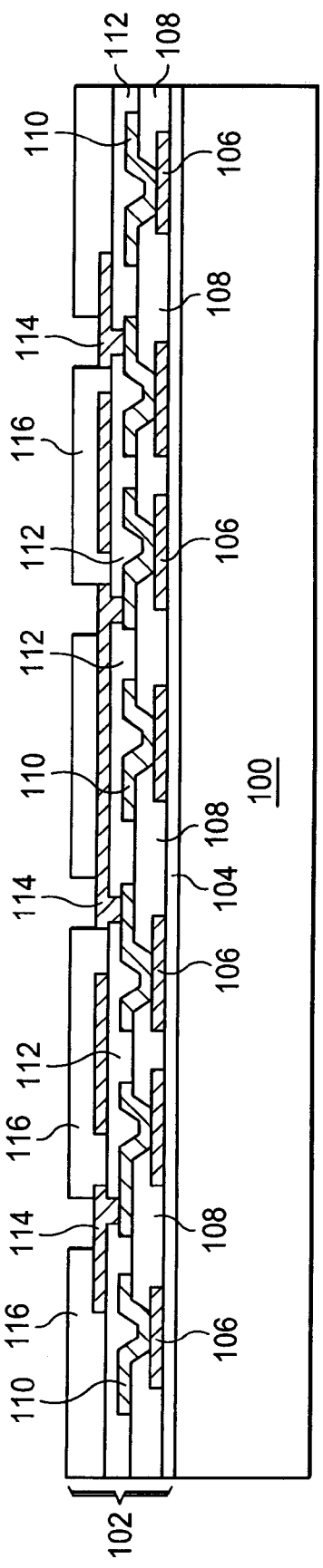
FIGS. 3a-3c illustrate a process of forming a shielding layer over a semiconductor die after forming a build-up interconnect layer.
Figure 3B:
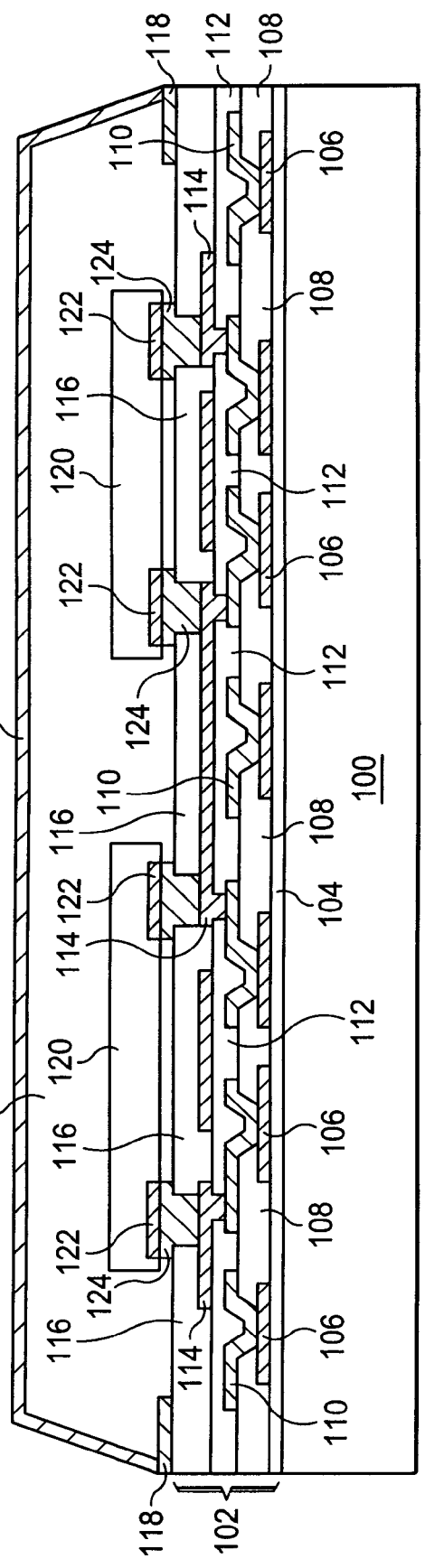
Figure 3C:
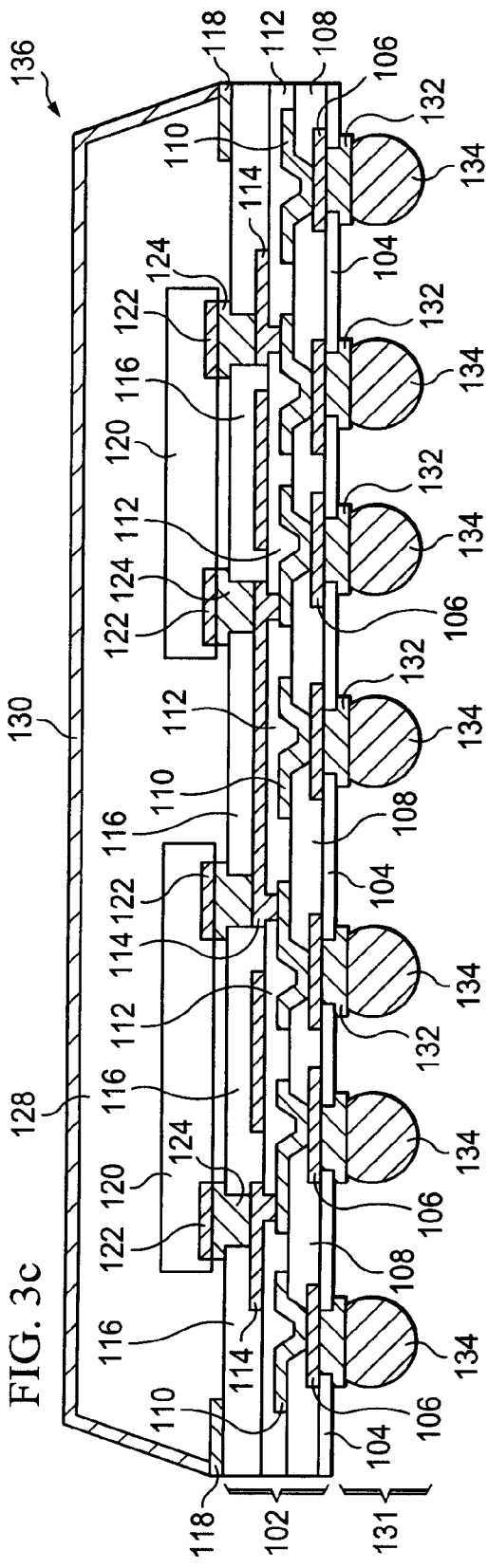

FIGS. 3a-3c illustrate a process of forming a shielding layer over semiconductor die after forming the build-up interconnect structure. In FIG. 3a, a substrate or wafer 100 contains dummy or sacrificial base material such as silicon (Si), polymer, polymer composite, metal, ceramic, glass, glass epoxy, beryllium oxide, or other suitable low-cost, rigid material or bulk semiconductor material for structural support.

A build-up interconnect layer 102 is formed on substrate 100. The build-up interconnect layer 102 includes an insulating or passivation layer 104 formed on substrate 100. The insulating layer 104 can be silicon dioxide (SiO2), silicon nitride (Si3N4), silicon oxynitride (SiON), tantalum pentoxide (Ta2O5), zircon (ZrO2), aluminum oxide (Al2O3), polyimide, benzocyclobutene (BCB), polybenzoxazoles (PBO), or other material having similar insulating and structural properties. The insulating layer 104 is deposited using PVD, CVD, printing, spin coating, spray coating, sintering or thermal oxidation. The insulating layer 104 can be made with single or multiple layers.

An electrically conductive layer 106 is formed on insulating layer 104 using a patterning and deposition process. The individual portions of conductive layer 106 can be electrically common or electrically isolated depending on the design and function of the semiconductor device. Conductive layer 106 can be Al, Cu, Sn, Ni, Au, Ag, or other suitable electrically conductive material. The deposition of conductive layer 106 uses PVD, CVD, electrolytic plating, or electroless plating process.

An insulating or passivation layer 108 is formed on insulating layer 104 and conductive layer 106. The insulating layer 108 can be SiO2, Si3N4, SiON, Ta2O5, ZrO2, Al2O3, polyimide, BCB, PBO, or other material having similar insulating and structural properties. The insulating layer 108 is deposited using PVD, CVD, printing, spin coating, spray coating, sintering or thermal oxidation. The insulating layer 108 can be made with single or multiple layers. A portion of insulating layer 108 is removed by an etching process to expose conductive layer 106.

An electrically conductive layer 110 is formed on insulating layer 108 and conductive layer 106 using a patterning and deposition process. Conductive layer 110 can be Al, Cu, Sn, Ni, Au, Ag, or other suitable electrically conductive material. The deposition of conductive layer 110 involves PVD, CVD, evaporation, electrolytic plating, electroless plating, or other suitable metal deposition process. Conductive layer 110 is a redistribution layer (RDL) for extending the interconnectivity of conductive layer 106.

An insulating or passivation layer 112 is formed on insulating layer 108 and conductive layer 110. The insulating layer 112 can be SiO2, Si3N4, SiON, Ta2O5, ZrO2, Al2O3, polyimide, BCB, PBO, or other material having similar insulating and structural properties. The insulating layer 112 is deposited using PVD, CVD, printing, spin coating, spray coating, sintering or thermal oxidation. The insulating layer 112 can be made with single or multiple layers. A portion of insulating layer 112 is removed by an etching process to expose conductive layer 110.

An electrically conductive layer 114 is formed on insulating layer 112 and conductive layer 110 using a patterning and deposition process. Conductive layer 114 can be Al, Cu, Sn, Ni, Au, Ag, or other suitable electrically conductive material. The deposition of conductive layer 114 involves PVD, CVD, evaporation, electrolytic plating, electroless plating, or other suitable metal deposition process.

An insulating or passivation layer 116 is formed on insulating layer 112 and conductive layer 114. The insulating layer 116 can be SiO2, Si3N4, SiON, Ta2O5, ZrO2, Al2O3, polyimide, BCB, PBO, or other material having similar insulating and structural properties. The insulating layer 116 is deposited using PVD, CVD, printing, spin coating, spray coating, sintering or thermal oxidation. The insulating layer 116 can be made with single or multiple layers. A portion of insulating layer 116 is removed by an etching process to expose conductive layer 114.

In FIG. 3b, an electrically conductive layer 118 is formed on insulating layer 116 using a patterning and deposition process. Conductive layer 118 can be Al, Cu, Sn, Ni, Au, Ag, or other suitable electrically conductive material. The deposition of conductive layer 118 involves PVD, CVD, evaporation, electrolytic plating, electroless plating, or other suitable metal deposition process. Conductive layer 118 provides ground pads, which are connected to an external low-impedance ground point. The ground pads 118 can be formed as islands or ring around a peripheral region above substrate 100. Ground pads 118 can also be formed at the central region of the device. In either case, ground pads 118 are typically formed at the same time as build-up interconnect layer 102.

Semiconductor die 120 are mounted to build-up interconnect layer 102. Contact pads 122 on semiconductor die 120 electrically connect to conductive layer 114 using electrical connections 124, e.g., solder bumps, stud bumps, conductive paste, or wirebonds.

Semiconductor die 120 may contain baseband circuits that generate electromagnetic interference (EMI), radio frequency interference (RFI), or other inter-device interference, such as capacitive, inductive, or conductive coupling. In other embodiments, semiconductor die 120 contain integrated passive devices (IPD) that are susceptible to EMI, RFI, and inter-device interference. For example, the IPDs contained within semiconductor die 120 provide the electrical characteristics needed for high frequency applications, such as resonators, high-pass filters, low-pass filters, band-pass filters, symmetric Hi-Q resonant transformers, and tuning capacitors. The IPDs can be used as front-end wireless RF components, which can be positioned between the antenna and transceiver. The IPD inductor can be a hi-Q balun, transformer, or coil, operating up to 100 Gigahertz. In some applications, multiple baluns are formed on a same substrate, allowing multi-band operation. For example, two or more baluns are used in a quad-band for mobile phones or other global system for mobile (GSM) communications, each balun is dedicated for a frequency band of operation of the quad-band device. A typical RF system requires multiple IPDs and other high frequency circuits in one or more semiconductor packages to perform the necessary electrical functions.

An encapsulant or molding compound 128 is deposited over semiconductor die 120, build-up interconnect layer 102, and conductive layer 118 using a paste printing, compressive molding, transfer molding, liquid encapsulant molding, or other suitable applicator. Encapsulant 128 can be epoxy resin, epoxy acrylate, polymer, or polymer composite material. Encapsulant 128 is non-conductive and environmentally protects the semiconductor device from external elements and contaminants.

To reduce EMI and RFI, an electrically conductive shielding layer 130 with an optional seed layer is conformally deposited over the top and sides of encapsulant 128. Shielding layer 130 is formed after build-up interconnect layer 102 to simplify the manufacturing process. Shielding layer 130 can be Cu, Al, stainless steel, nickel silver, low-carbon steel, silicon-iron steel, foil, epoxy, conductive resin, and other metals and composites capable of blocking EMI, RFI, and other inter-device interference. The seed layer can be made with Cu, Ni, nickel vanadium (NiV), Au, or Al. The seed layer and shielding layer 130 are patterned and conformally deposited using an electrolytic plating, electroless plating, sputtering, PVD, CVD, or other suitable metal deposition process. For non-metal materials, shielding layer 130 can be applied by lamination, spraying, or painting.

Shielding layer 130 substantially covers all areas of encapsulant 128 relative to the top and sides of semiconductor die 120 to provide isolation from EMI, RFI, or other inter-device interference. The sides of encapsulant can have a tapered or vertical geometry. Shielding layer 130 electrically contacts ground pads 118, either with an incline or straight profile. Ground pads 118 provide a conduction path to route interfering signals from shielding layer 130 to an external low-impedance ground point.

In FIG. 3c, substrate 100 is removed by mechanical grinding, CMP, wet etching, dry etching, plasma etching, or another suitable process. After removal of substrate 100, an interconnect structure 131 is formed on a backside of build-up interconnect structure 102, opposite semiconductor die 120.

To form backside interconnect structure 131, a portion of insulating layer 104 is removed by etching to expose conductive layer 106. An electrically conductive layer 132 is patterned and deposited on conductive layer 106 using PVD, CVD, evaporation, electrolytic plating, electroless plating, or other suitable metal deposition process. Conductive layer 132 can be Al, Cu, Sn, Ni, Au, Ag, or other suitable electrically conductive material. Conductive layer 132 is a UBM in electrical contact with conductive layer 106. UBMs 132 can be a multiple metal stack with adhesion layer, barrier layer, and seed or wetting layer. The adhesion layer is formed over conductive layer 106 and can be Ti, TiN, TiW, Al, or Cr. The barrier layer is formed over the adhesion layer and can be made of Ni, NiV, platinum Pt, Pd, TiW, or CrCu. The barrier layer inhibits the diffusion of Cu into the active area of the die. The seed layer can be Cu, Ni, NiV, Au, or Al. The seed layer is formed over the barrier layer and acts as an intermediate conductive layer between conductive layer 106 and subsequent solder bumps or other interconnect structure. UBMs 132 provide a low resistive interconnect to conductive layer 106, as well as a barrier to solder diffusion and seed layer for solder wettability.

An electrically conductive solder material is deposited over UBM 132 using an evaporation, electrolytic plating, electroless plating, ball drop, or screen printing process. The solder material can be any metal or electrically conductive material, e.g., Sn, Ni, Au, Ag, Pb, Bi, and alloys thereof, with an optional flux material. For example, the solder material can be eutectic Sn/Pb, high-lead, or lead-free. The solder material is reflowed by heating the material above its melting point to form spherical balls or bumps 134. In some applications, solder bumps 134 are reflowed a second time to improve electrical contact to UBM 132. Solder bumps 134 represent one type of backside interconnect structure that can be formed on UBM 132. The backside interconnect structure can also use bond wires, 3-D interconnects, conductive paste, stud bump, micro bump, or other electrical interconnect.

The resulting semiconductor package 136 provides EMI and RFI shielding for the top and sides of semiconductor die 120. The conformal shielding layer 130 is connected to ground pads 118 to route interfering signals to an external low-impedance ground point.

Figure 4:
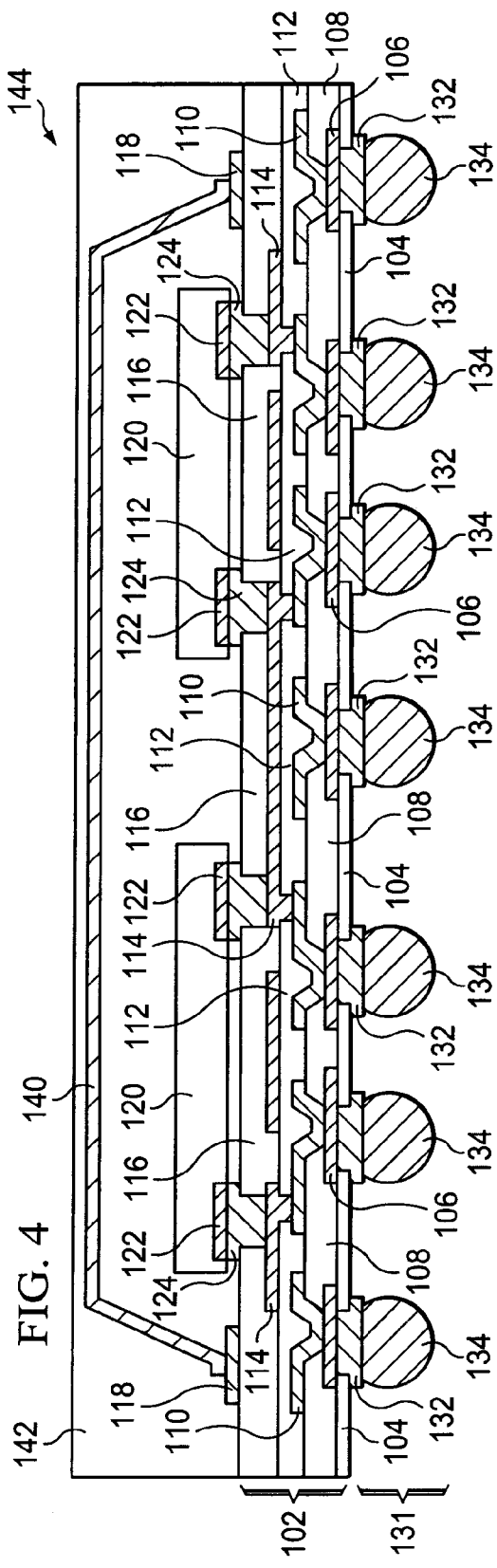
FIG. 4 illustrates a shielding cage formed over the semiconductor die prior to forming the encapsulant.

Another embodiment of forming a shielding structure over semiconductor die after forming the build-up interconnect structure in shown in FIG. 4. The build-up interconnect structure 102 is formed on a temporary substrate as described in FIG. 3a.

An electrically conductive layer 118 is formed on insulating layer 116 using a patterning and deposition process. Conductive layer 118 can be Al, Cu, Sn, Ni, Au, Ag, or other suitable electrically conductive material. The deposition of conductive layer 118 involves PVD, CVD, evaporation, electrolytic plating, electroless plating, or other suitable metal deposition process. Conductive layer 118 provides ground pads, which are connected to an external low-impedance ground point.

Semiconductor die 120 are mounted to build-up interconnect layer 102. Contact pads 122 on semiconductor die 120 electrically connect to conductive layer 114 using electrical connections 124, e.g., solder bumps, stud bumps, conductive paste, or wirebonds.

An electrically conductive shielding cage 140 is mounted over semiconductor die 120 after formation of build-up interconnect layer 102. Shielding cage 140 can be Cu, Al, stainless steel, nickel silver, low-carbon steel, silicon-iron steel, foil, epoxy, conductive resin, and other metals and composites capable of blocking EMI, RFI, and other inter-device interference. Shielding cage 140 electrically connects to ground pads 118.

An encapsulant or molding compound 142 is deposited over shielding cage 140, semiconductor die 120, build-up interconnect layer 102, and conductive layer 118 using a paste printing, compressive molding, transfer molding, liquid encapsulant molding, or other suitable applicator. Shielding cage 140 has a plurality of openings to facilitate the flow of encapsulant inside the shielding cage, e.g., in and around semiconductor die 120. Accordingly, shielding cage 140 is embedded within encapsulant 142. Encapsulant 142 can be epoxy resin, epoxy acrylate, polymer, or polymer composite material. Encapsulant 142 is non-conductive and environmentally protects the semiconductor device from external elements and contaminants.

The temporary substrate is removed by mechanical grinding, CMP, wet etching, dry etching, plasma etching, or another suitable process. The interconnect structure including UBM 132 and solder bumps 134 are formed as described in FIG. 3c. The resulting semiconductor package 144 provides EMI and RFI shielding for the top and sides of semiconductor die 120. Shielding cage 140 is connected to ground pads 118 to route EMI, RFI, and other interfering signals to an external low-impedance ground point.

In another embodiment, FIG. 5 shows interconnect structure 102 which is formed on a temporary substrate as described in FIG. 3a. An electrically conductive layer 118 is formed on insulating layer 116 using a patterning and deposition process. Conductive layer 118 can be Al, Cu, Sn, Ni, Au, Ag, or other suitable electrically conductive material. The deposition of conductive layer 118 involves PVD, CVD, evaporation, electrolytic plating, electroless plating, or other suitable metal deposition process. Conductive layer 118 provides ground pads, which are connected to an external low-impedance ground point.

Semiconductor die 120 are mounted to build-up interconnect layer 102. Contact pads 122 on semiconductor die 120 electrically connect to conductive layer 114 using electrical connections 124, e.g., solder bumps, stud bumps, conductive paste, or wirebonds.

An electrically conductive shielding cage 150 is mounted over one or both of the semiconductor die 120 after formation of build-up interconnect layer 102. The semiconductor die 120 covered by shielding cage 150 may be particularly sensitive to EMI and RFI. Shielding cage 150 electrically connects to ground pads 118 to provide additional EMI and RFI isolation. Shielding cage 150 is formed after build-up interconnect layer 102 to simplify the manufacturing process. Shielding cage 150 can be Cu, Al, stainless steel, nickel silver, low-carbon steel, silicon-iron steel, foil, epoxy, conductive resin, and other metals and composites capable of blocking EMI, RFI, and other inter-device interference.

An encapsulant or molding compound 152 is deposited over shielding cage 150, semiconductor die 120, build-up interconnect layer 102, and conductive layer 118 using a paste printing, compressive molding, transfer molding, liquid encapsulant molding, or other suitable applicator. Shielding cage 150 has plurality of openings to facilitate the flow of encapsulant inside the shielding cage, e.g., in and around semiconductor die 120. Accordingly, shielding cage 150 is embedded within encapsulant 152. Encapsulant 152 can be epoxy resin, epoxy acrylate, polymer, or polymer composite material. Encapsulant 152 is non-conductive and environmentally protects the semiconductor device from external elements and contaminants.

An electrically conductive shielding layer 154 with an optional seed layer is conformally deposited over the top and sides of encapsulant 152. Shielding layer 154 is formed after build-up interconnect layer 102 to simplify the manufacturing process. Shielding layer 154 electrically connects to ground pads 118. Shielding layer 154 can be Cu, Al, stainless steel, nickel silver, low-carbon steel, silicon-iron steel, foil, epoxy, conductive resin, and other metals and composites capable of blocking EMI, RFI, and other inter-device interference. The seed layer can be made with Cu, Ni, NiV, Au, or Al. The seed layer and shielding layer 154 are patterned and conformally deposited using an electrolytic plating, electroless plating, sputtering, PVD, CVD, or other suitable metal deposition process. For non-metal materials, shielding layer 154 can be applied by lamination, spraying, or painting.

The temporary substrate is removed by mechanical grinding, CMP, wet etching, dry etching, plasma etching, or another suitable process. The interconnect structure including UBM 132 and solder bumps 134 are formed as described in FIG. 3c. The resulting semiconductor package 156 provides EMI and RFI shielding for the top and sides of semiconductor die 120. Shielding cage 150 and shielding layer 154 are connected to ground pads 118 to route EMI, RFI, and other interfering signals to an external low-impedance ground point.

FIG. 6 shows another embodiment of forming a shielding structure over semiconductor die after forming the build-up interconnect structure. The build-up interconnect structure 102 is formed on a temporary substrate as described in FIG. 3a.

Semiconductor die 160 is mounted to build-up interconnect layer 102. Some contact pads on semiconductor die 160 electrically connect to conductive layer 114 using bond wires 162, which in turn connected to an external low-impedance ground point. Other contact pads of semiconductor die 160 provide functional signal paths. Semiconductor die 164 is also mounted to build-up interconnect layer 102. Contact pads 166 on semiconductor die 164 electrically connect to conductive layer 114 using electrical connections 168, e.g., solder bumps, stud bumps, conductive paste, or wirebonds.

Conductive pillars or posts 170 are formed over semiconductor die 160. Conductive pillars 170 can be Cu, Al, tungsten (W), Au, solder, or other suitable electrically conductive material. In this embodiment, conductive pillars 170 are implemented as solder balls or stud bumps. Conductive pillars are electrically connected to bond wires 162.

An encapsulant or molding compound 172 is deposited over semiconductor die 160 and 164, build-up interconnect layer 102, conductive pillars 170, bond wires 162, and conductive layer 118 using a paste printing, compressive molding, transfer molding, liquid encapsulant molding, or other suitable applicator. Encapsulant 172 can be epoxy resin, epoxy acrylate, polymer, or polymer composite material. Encapsulant 172 is non-conductive and environmentally protects the semiconductor device from external elements and contaminants.

An electrically conductive shielding layer 174 with an optional seed layer is conformally deposited over the top and sides of encapsulant 172. Shielding layer 174 electrically connects to conductive pillars 170 and bond wires 162. Shielding layer 174 is formed after build-up interconnect layer 102 to simplify the manufacturing process. Shielding layer 174 can be Cu, Al, stainless steel, nickel silver, low-carbon steel, silicon-iron steel, foil, epoxy, conductive resin, and other metals and composites capable of blocking EMI, RFI, and other inter-device interference. The seed layer can be made with Cu, Ni, NiV, Au, or Al. The seed layer and shielding layer 174 are patterned and conformally deposited using an electrolytic plating, electroless plating, sputtering, PVD, CVD, or other suitable metal deposition process. For non-metal materials, shielding layer 174 can be applied by lamination, spraying, or painting.

The temporary substrate is removed by mechanical grinding, CMP, wet etching, dry etching, plasma etching, or another suitable process. The interconnect structure including UBM 132 and solder bumps 134 are formed as described in FIG. 3c. The resulting semiconductor package 176 provides EMI and RFI shielding for the top and sides of semiconductor die 160 and 164. Shielding layer 174 is connected through conductive pillars 170 and bond wires 162 to route EMI, RFI, and other interfering signals to an external low-impedance ground point.

Figure 7:
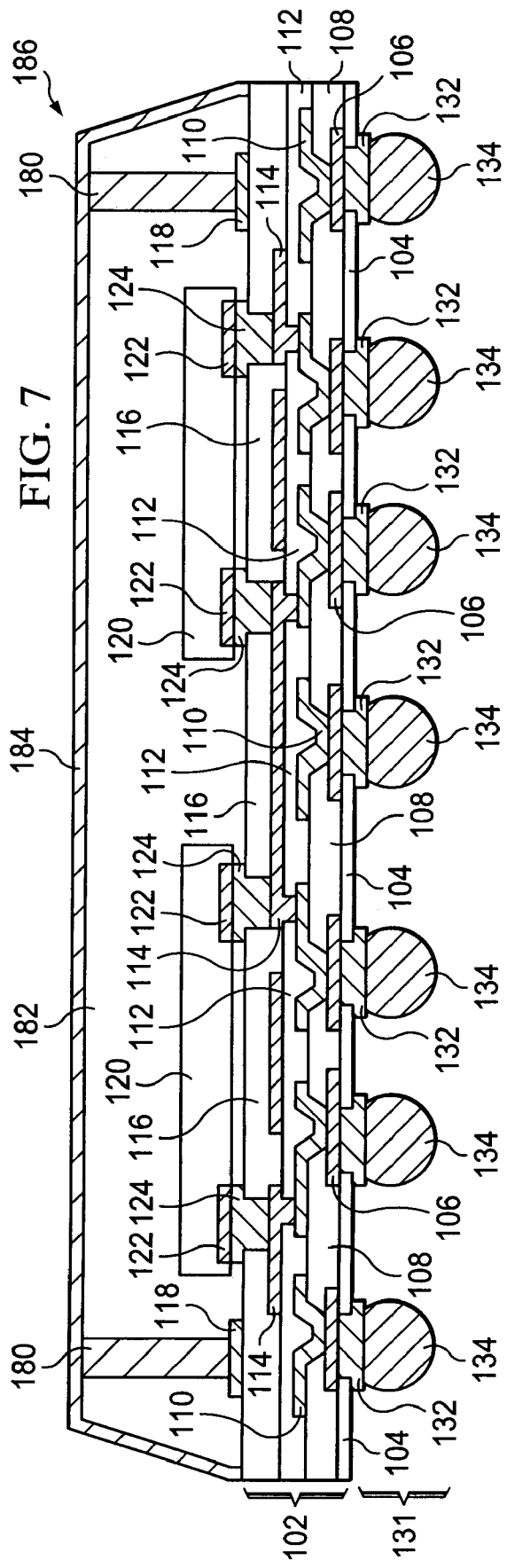
FIG. 7 illustrates the conductive pillar implemented as a bar or rod of conductive material electrically connecting the shielding layer to a ground point.

FIG. 7 shows another embodiment of forming a shielding structure over semiconductor die after forming the build-up interconnect structure. The build-up interconnect structure 102 is formed on a temporary substrate as described in FIG. 3a.

An electrically conductive layer 118 is formed on insulating layer 116 using a patterning and deposition process. Conductive layer 118 can be Al, Cu, Sn, Ni, Au, Ag, or other suitable electrically conductive material. The deposition of conductive layer 118 involves PVD, CVD, evaporation, electrolytic plating, electroless plating, or other suitable metal deposition process. Conductive layer 118 provides ground pads, which are connected to an external low-impedance ground point.

Semiconductor die 120 are mounted to build-up interconnect layer 102. Contact pads 122 on semiconductor die 120 electrically connect to conductive layer 114 using electrical connections 124, e.g., solder bumps, stud bumps, conductive paste, or wirebonds.

Conductive pillars or posts 180 are formed over conductive layer 118 as a rod or bar of conductive material. Conductive pillars 180 can be Cu, Al, W, Au, solder, or other suitable electrically conductive material. In this embodiment, a thick layer of photoresist is deposited over insulating layer 116 and conductive layer 118. The photoresist can be a liquid or a dry film with a thickness of 50 to 125 μm. Two layers of photoresist may be applied to achieve the desired thickness. The photoresist is patterned using photolithography. The conductive material is deposited in the patterned areas of the photoresist using electrolytic plating. The photoresist is stripped away leaving behind individual conductive pillars 180. Conductive pillars 180 electrically connect to ground pads 118.

An encapsulant or molding compound 182 is deposited over semiconductor die 120, build-up interconnect layer 102, conductive pillars 180, and conductive layer 118 using a paste printing, compressive molding, transfer molding, liquid encapsulant molding, or other suitable applicator. Encapsulant 182 can be epoxy resin, epoxy acrylate, polymer, or polymer composite material. Encapsulant 182 is non-conductive and environmentally protects the semiconductor device from external elements and contaminants.

An electrically conductive shielding layer 184 with an optional seed layer is conformally deposited over the top and sides of encapsulant 182. Shielding layer 184 electrically connects to conductive pillars 180. Shielding layer 184 is formed after build-up interconnect layer 102 to simplify the manufacturing process. Shielding layer 184 can be Cu, Al, stainless steel, nickel silver, low-carbon steel, silicon-iron steel, foil, epoxy, conductive resin, and other metals and composites capable of blocking EMI, RFI, and other inter-device interference. The seed layer can be made with Cu, Ni, NiV, Au, or Al. The seed layer and shielding layer 184 are patterned and conformally deposited using an electrolytic plating, electroless plating, sputtering, PVD, CVD, or other suitable metal deposition process. For non-metal materials, shielding layer 184 can be applied by lamination, spraying, or painting.

The temporary substrate is removed by mechanical grinding, CMP, wet etching, dry etching, plasma etching, or another suitable process. The interconnect structure including UBM 132 and solder bumps 134 are formed as described in FIG. 3c. The resulting semiconductor package 186 provides EMI and RFI shielding for the top and sides of semiconductor die 120. Shielding layer 184 is connected through conductive pillars 180 to conductive layer 118 in order to route EMI, RFI, and other interfering signals to an external low-impedance ground point.

While one or more embodiments of the present invention have been illustrated in detail, the skilled artisan will appreciate that modifications and adaptations to those embodiments may be made without departing from the scope of the present invention as set forth in the following claims.

What is claimed is:

1. A method of making a semiconductor device, comprising:
   providing a substrate;
   forming a build-up interconnect structure over the substrate;
   mounting a semiconductor die to the build-up interconnect structure, the semiconductor die being electrically connected to the build-up interconnect structure;
   forming a ground pad on the build-up interconnect structure;
   forming an encapsulant over the semiconductor die and the build-up interconnect structure;
   forming a shielding layer over the encapsulant after forming the build-up interconnect structure to isolate the semiconductor die from inter-device interference, the shielding layer conforming to a geometry of the encapsulant and electrically connecting to the ground pad;
   removing the substrate; and
   forming a backside interconnect structure over the build-up interconnect structure, opposite the semiconductor die.

2. The method of making a semiconductor device according to claim 1, further including forming a shielding cage over the semiconductor die prior to forming the encapsulant.

3. The method of making a semiconductor device according to claim 1, wherein the build-up interconnect structure includes:
   forming a plurality of conductive layers; and
   forming a plurality of insulating layers between the conductive layers.

4. The method of making a semiconductor device according to claim 1, wherein a side of the encapsulant has a tapered or vertical geometry.

5. The method of making a semiconductor device according to claim 1, wherein the shielding layer electrically connects to the ground pad at an incline or straight profile.

6. The method of making a semiconductor device according to claim 1, wherein the ground pads are formed as islands or ring around a peripheral region of the substrate.

7. A method of making a semiconductor device, comprising:
   providing a substrate;
   forming a build-up interconnect structure over the substrate;
   mounting a semiconductor die to the build-up interconnect structure, the semiconductor die being electrically connected to the build-up interconnect structure;
   forming a shielding cage over the semiconductor die after forming the build-up interconnect structure to isolate the semiconductor die from inter-device interference, the shielding cage being electrically connected to a ground point;
   forming an encapsulant over the semiconductor die, the shielding cage, and the build-up interconnect structure; and
   removing the substrate.

8. The method of making a semiconductor device according to claim 7, further including forming a backside interconnect structure over the build-up interconnect structure, opposite the semiconductor die.

9. The method of making a semiconductor device according to claim 7, further including forming a shielding layer over the encapsulant, the shielding layer conforming to a geometry of the encapsulant and electrically connecting to the ground point.

10. The method of making a semiconductor device according to claim 7, further including forming a conductive pillar to electrically connect the shielding layer to the ground point.

11. The method of making a semiconductor device according to claim 10, wherein the conductive pillar is implemented with a plurality of studs or bumps or as a rod of conductive material.

12. The method of making a semiconductor device according to claim 7, wherein the build-up interconnect structure includes:
  forming a plurality of conductive layers; and
  forming a plurality of insulating layers between the conductive layers.

13. The method of making a semiconductor device according to claim 7, wherein the shielding layer electrically connects to the ground point at an incline or straight profile.

14. A method of making a semiconductor device, comprising:
  providing a substrate;
  forming a build-up interconnect structure over the substrate;
  mounting a semiconductor die to the build-up interconnect structure;
  forming an encapsulant over the semiconductor die and the build-up interconnect structure;
  forming a shielding layer over the semiconductor die after forming the build-up interconnect structure to isolate the semiconductor die from inter-device interference, the shielding layer being electrically connected to a ground point; and
  removing the substrate.

15. The method of making a semiconductor device according to claim 14, wherein the semiconductor die is electrically connected to the build-up interconnect structure.

16. The method of making a semiconductor device according to claim 14, further including forming a backside interconnect structure over the build-up interconnect structure, opposite the semiconductor die.

17. The method of making a semiconductor device according to claim 14, further including forming a shielding cage over the semiconductor die, the shielding cage being electrically connected to the ground point.

18. The method of making a semiconductor device according to claim 14, further including forming a conductive pillar to electrically connect the shielding layer to the ground point.

19. The method of making a semiconductor device according to claim 18, wherein the conductive pillar is implemented with a plurality of studs or bumps or as a rod of conductive material.

20. The method of making a semiconductor device according to claim 14, wherein the build-up interconnect structure includes:
  forming a plurality of conductive layers; and
  forming a plurality of insulating layers between the conductive layers.

* * * * *